(12) United States Patent
Fritsch et al.

(10) Patent No.: US 7,321,227 B2
(45) Date of Patent: Jan. 22, 2008

(54) MEASURING ELECTRICAL CURRENT FLOWING THROUGH A CONDUCTOR

(75) Inventors: Christian Fritsch, Waldkirch (DE); Ekkehard Mann, Gundelfingen (DE)

(73) Assignee: Huettinger Elektronik GmbH + Co. KG, Freiburg (DE)

( * ) Notice: Subject to any disclaimer, the term of this patent is extended or adjusted under 35 U.S.C. 154(b) by 0 days.

(21) Appl. No.: 11/279,443

(22) Filed: Apr. 12, 2006

(65) Prior Publication Data
US 2006/0232265 A1    Oct. 19, 2006

(30) Foreign Application Priority Data
Apr. 13, 2005   (DE) ............... 10 2005 016 996

(51) Int. Cl.
*G01R 11/32*   (2006.01)
(52) U.S. Cl. .............. 324/142; 324/117 R; 324/126; 324/127
(58) Field of Classification Search ..... 324/117 R–117 H, 126–127, 142; 336/84 R; 702/60, 85; 505/842, 845
See application file for complete search history.

(56) References Cited

U.S. PATENT DOCUMENTS

| | | | | |
|---|---|---|---|---|
| 1,809,285 | A | * | 6/1931 | Peters .................. 361/290 |
| 4,611,191 | A | * | 9/1986 | Souchere ............... 336/84 R |
| 4,616,176 | A |   | 10/1986 | Mercure et al. |
| 4,841,235 | A |   | 6/1989 | Hastings et al. |
| 4,897,600 | A |   | 1/1990 | Hagmann et al. |
| 5,506,373 | A | * | 4/1996 | Hoffman ............... 174/373 |
| 5,939,886 | A |   | 8/1999 | Turner et al. |
| 6,184,672 | B1 | * | 2/2001 | Berkcan ............... 324/117 R |
| 6,566,854 | B1 | * | 5/2003 | Hagmann et al. ....... 324/117 R |

FOREIGN PATENT DOCUMENTS

| | | |
|---|---|---|
| EP | 0 365 216 | 6/1998 |
| EP | 0 675 368 | 8/2002 |
| EP | 0 751 536 | 4/2003 |
| KR | 10-2001-0027246 | 4/2001 |

OTHER PUBLICATIONS

Hewson, :The effect of electrostatic screening of Rogowski coils designed for wide-bandwidth current measurement in power electronic applications, 2004 35th Annual IEEE Power Electronics Specialists Conference, 2004, pp. 1143-1148.
Honea et al., "Improved construction of Rogowski coils for measurement of plasma currents", Journal of Physics E. Scientific Instruments, 1974. vol. 7, pp. 537-538.
Wurden et al., "Steady-State Position Control for the Tokamak Physics Experiment (TPX)", Los Alamos National Laboratory, Mar. 24, 2005, pp. 1-19.
Office Action from Korean Application No. 10-2006-0033567, mailed Aug. 28, 2007, 5 pages; English translation of Office Action from Korean Application No. 10-2006-0033567, mailed Aug. 28, 2007, 4 pages.

* cited by examiner

*Primary Examiner*—Vinh P. Nguyen
(74) *Attorney, Agent, or Firm*—Fish & Richardson P.C.

(57) ABSTRACT

A current measurement device for measuring an electrical current, in particular in a contactless manner, in a current-carrying conductor, using a coil arrangement having a coil conductor and a circuit connected to the coil conductor, the coil arrangement being surrounded at least in portions by a coil shield. The coil shield and the circuit are connected to a ground potential independently of each other. The measurement accuracy is thereby increased.

24 Claims, 2 Drawing Sheets

MEASURING ELECTRICAL CURRENT FLOWING THROUGH A CONDUCTOR

RELATED APPLICATION

Under 35 U.S.C. § 119, this application claims the benefit of a foreign priority application filed in Germany, serial number 10 2005 016 996.1-35, filed Apr. 13, 2005.

TECHNICAL FIELD

The invention relates to measuring an electric current in a current-carrying conductor, using a coil surrounded at least in portions by a coil shield.

BACKGROUND

The excitation of a plasma by high-frequency power current supplies is known, for example, from semiconductor coating, plasma etching, laser excitation, etc. For various reasons, it is necessary to measure and monitor the current supplied to a plasma system by the current supply.

There is known a coil-based system for measuring relatively high high-frequency currents of up to several tens of amperes with relatively few distortions caused by electrical and electromagnetic fields less than 100 V/m.

In new developments in plasma technology, current measurement in high-frequency plasma applications is required in which currents flow far in excess of 100 A at from one to several hundreds of MHz and voltages greater than 1000 V, often even greater than 5000 V, are present at the current conductors, at frequencies of from 0 (direct voltage) up to several hundreds of MHz. At a distance of a few cm (e.g., less than about 10 cm) from a current-carrying conductor which is at a potential of 1000 V, interference fields of 10 kV/m and above are produced and can negatively influence the current measurement or even make current measurement impossible with conventional measurement devices.

The currents which can be induced in the coil of a conventional current measurement arrangement would be in many instances too high to be reasonably discharged directly to a connection. In general, unacceptable losses and measurement distortions would be produced if a large current on the order of 1 A, with signals in the MHZ range (1-100 MHz) were to be conducted to a measurement signal evaluation unit by means of a measurement cable.

Honea et al., "Improved construction of Rogowski coils for measurement of plasma currents", Journal of Physics E: Scientific Instruments 1974, Volume 7, pages 537, 538, disclose the use of a Rogowski coil for measuring currents. The Rogowski coil has a shield which is connected to the coil conductor so that the shield and the coil conductor are at the same potential in at least one location.

What is needed is a current measurement device with which high-frequency currents can be precisely measured even when strong interference fields are present.

SUMMARY

In many respects the invention features a current measurement device in which a coil shield and a protective circuit are connected to a ground potential independently of each other. It will be appreciated that, in order to measure currents, the coil arrangement has to be arranged in the region of a current-carrying conductor in such a manner that a signal which describes the current in the current-carrying conductor, in particular a signal proportional to the current, is produced in the coil conductor which preferably encloses in a plurality of windings a portion of the magnetic field produced by the current-carrying conductor. To that end, the coil conductor of the coil arrangement preferably has two connections, at which the signal that describes the current in the current-carrying conductor is present. Using such an arrangement, it is possible to measure currents in a highly precise manner in a current conductor which conducts a high-frequency current from a high-frequency plasma current supply system to a plasma excitation device, wherein the current may be greater than 100 A at frequencies of from 1 MHz up to several hundreds of MHz, and interference field strengths of 10 kV/m and more may be present which at most result in negligible distortions of the measurement results. Therefore, the susceptibility to interference is reduced.

It is particularly preferable for the coil shield and the circuit each to have a ground connection, the ground connections being connected to a ground potential and spaced apart from each other. This means that the circuit also has its own connection to the ground potential, which connection is fitted in a spatially separate manner relative to the connection of the shield, in particular at a location at which no high equalizing currents flow. The measurement signal is thereby not distorted.

It is possible to connect the coil shield and the circuit to a common ground plate. It should be ensured that the connections to a ground plate are located remote from each other to such an extent that no equalizing currents, or only negligible equalizing currents, flow. Alternatively, it is possible to connect the circuit and the coil shield to different ground plates. The ground plates can be connected by an inductance having very low direct current resistance (e.g., less than 0.1 Ohm).

In a particularly preferred configuration, there may be provision for the circuit to include a shield and for the shield to be connected to the ground potential. This means that the connection of the circuit to the ground potential can be produced via the shield of the circuit if the circuit is connected to the shield in an electrically conductive manner.

If the coil arrangement is constructed in a circular manner, the coil arrangement can be positioned in a circular manner around the current-carrying conductor. The coil arrangement is preferably located in a plane perpendicular to the current-carrying conductor. In such an arrangement, it is possible to measure currents in a particularly precise and reliable manner.

The coil shield is preferably also constructed in a circular manner, in particular in the form of a hollow body toroid. Reliable shielding of the coil arrangement relative to an electrical field having an interference voltage produced, for example, by the current of the current-carrying conductor can thereby be effected within a small amount of installation space.

It is particularly advantageous for the coil shield to be open, at least in portions, in particular to be open at the side remote from the current-carrying conductor. It is particularly preferable for the shield to be constructed as a hollow body toroid which is outwardly open, that is to say, not completely closed in a peripheral direction, and in which the coil arrangement can be arranged. Particularly good shielding with respect to electrical fields is thereby obtained. A closed (hollow) toroid, that is to say, a shield which completely surrounds the coil arrangement in a peripheral direction, would completely shield electromagnetic fields and can therefore not be used because, in that case, the coil arrangement would no longer be responsive to current flowing in the conductor.

The coil shield is preferably formed of copper and is preferably at least 1 mm thick. Such a coil shield can dissipate high power coupled into the ground potential particularly well, without producing high voltages. The heat produced can also be dissipated well by copper.

In one configuration, there may be provision for the coil arrangement to be constructed in a ferrite-free manner, in particular to be constructed as a Rogowski coil. The coil arrangement preferably has no ferromagnetic parts. A Rogowski coil is intended to refer to a coil with a coil conductor wound, at least in portions, in a plurality of windings on a non-ferromagnetic carrier, in particular a non-ferritic carrier, having length 'l'. The coil conductor extends in windings from one end of the carrier to the opposite end of the carrier. From there, the coil conductor is guided back inside the windings so that both coil conductor ends or connections are accessible close to each other. If the carrier is constructed in a circular manner, in particular as a slotted circle, the coil arrangement can be arranged particularly readily around the current-carrying conductor.

The advantages of Rogowski coils include that no saturation or ferromagnetic distortions are produced. For that reason, very high current rise rates (e.g., greater than 40000 A/µs) and very high currents (e.g., greater than 1000 A) can be measured at several hundreds of MHz. Furthermore, the current-carrying conductor does not have to be interrupted in order to fit the Rogowski coil. Therefore, it is suitable for the new demands placed on systems for measuring currents in plasma installations.

It is particularly advantageous for the circuit to have at least one impedance, in particular a resistance. If an impedance, in particular a resistance, is connected to both connections of the coil arrangement, in particular the coil conductor, a voltage proportional to the current in the current-carrying conductor is applied at that impedance. In the case of high currents to be measured, the currents in the coil arrangement are also relatively high, such as up to a few amperes. Such high currents cannot be conducted through a measurement cable to a remote evaluation unit without the risk of measurement signal distortions owing to the measurement cable. Therefore, a circuit is fitted directly beside the coil arrangement (preferably within a few centimeters of the coil) and also includes a shield. The circuit has, in the simplest case, only one impedance, at which a voltage is applied owing to the current in the coil arrangement, which voltage can be tapped. The voltage level of the measurement signal can be adjusted with the resistance value. That measurement signal can readily be guided to the measurement signal evaluation unit without great distortions.

The circuit preferably has at least one measurement connection in order to connect an evaluation device. The circuit advantageously has two connections, to which the measurement signal is applied, one of the connections being connected to ground potential. The measurement accuracy can thereby be increased. The ground potential is preferably at a location at which low equalizing currents flow, so that only small distortions are potentially caused by other ground connections.

High electrical losses, which can produce a high level of dissipated heat, can be produced by the equalizing currents in the coil shield. Such heat can potentially damage or destroy the coil arrangement. Therefore, it is advantageous for the coil shield to be cooled with coolant, such as water.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
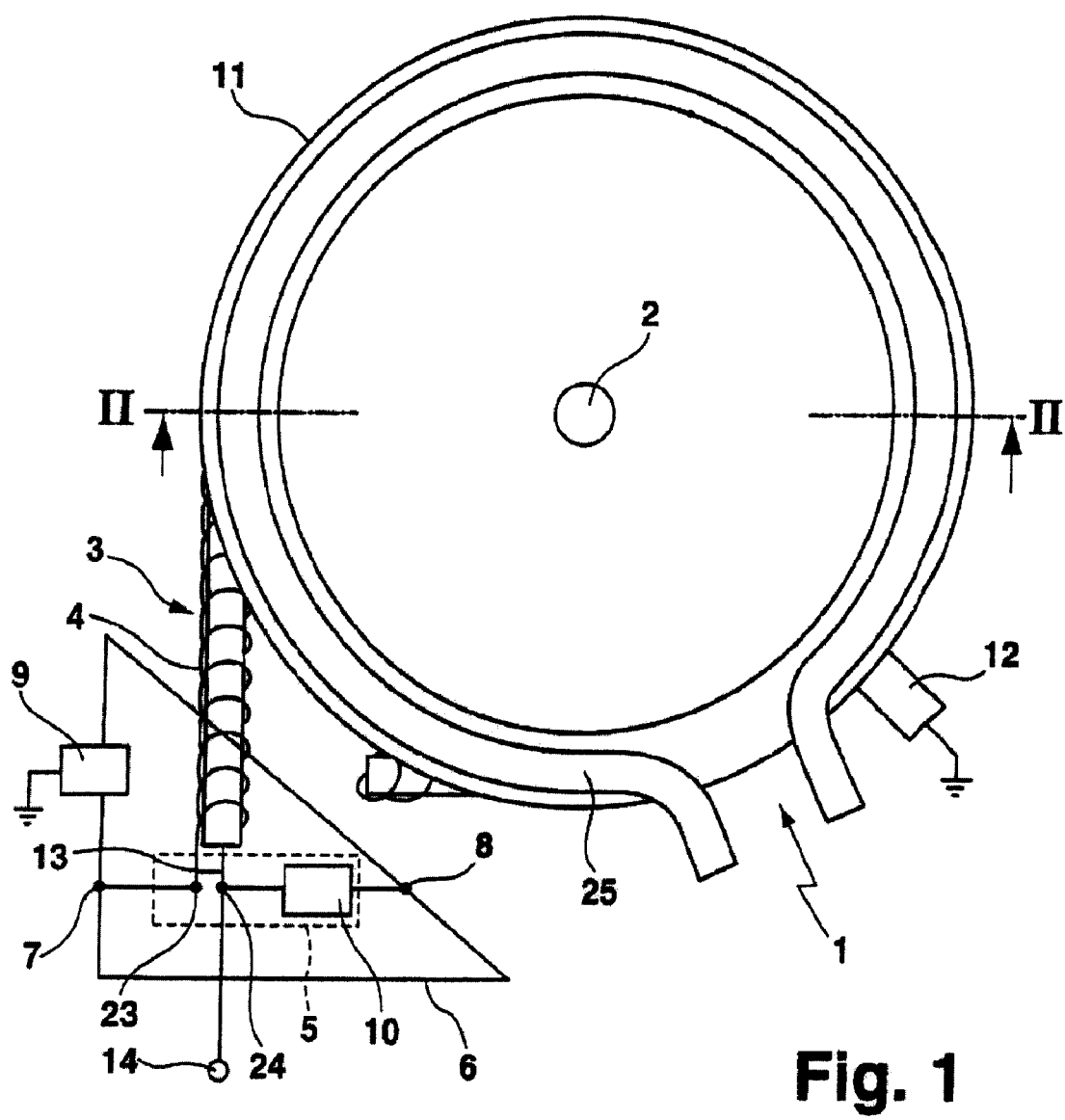
FIG. 1 is a schematic top view of a current measurement device.

FIG. 1 illustrates a current measurement device 1 for measuring a current through a current-carrying conductor 2. The current measurement device 1 has a coil arrangement 3 which is in the form of a Rogowski coil. The coil arrangement 3 includes a coil conductor 4 which has a plurality of windings. The coil conductor 4 extends in windings along, in particular as far as the end of, a coil carrier (not illustrated in FIG. 1) and is guided back inside the windings. The coil carrier can be constructed as a closed or non-closed (i.e., open) ring.

The coil conductor 4 is connected to a circuit 5 arranged inside a shield 6 that is considered to be part of the circuit 5. The coil conductor 4 is connected to the shield 6 at connection point 7.

The shield 6, and therefore the circuit 5, has a ground connection 9. The circuit 5 contains an impedance 10 in the form of a resistance and which is connected to the shield 6 and therefore the ground potential at connection 8. The coil conductor 4 has two connections 23 and 24. It is connected to the shield 6 at the connection point 7 with the connection 23, and is connected to the impedance 10 with the connection 24. The connection 23 of the coil conductor 4 is connected to the impedance 10 by means of the shield 6 and the connections 7, 8. The impedance 10 is consequently connected to both connections 23, 24.

The coil arrangement 3 has a coil shield 11 which has a ground connection 12. The ground connections 9, 12 are spaced apart from each other so that no equalizing currents, or only small equalizing currents, flow between the ground connections 9, 12. The circuit shield 6 does not have a direct connection to the coil shield 11. Rather, there is provided an indirect connection by way of the ground connections 9, 12 and, for example, one or more ground plates to which the ground connections 9, 12 are connected with spacing relative to each other.

One current conductor end 13 is connected, in addition to being connected to the impedance 10, to a measurement connection 14, to which an evaluation device (not illustrated) can be connected by means of a measurement cable. A second connection of the measurement cable can be connected to the shield 6 and therefore to a ground potential with low distortion levels. That connection can be used as a shield for the measurement cable of the measurement connection 14 to the evaluation device. If a current flows in the current-carrying conductor 2, a voltage is induced in the coil conductor 4 and in turn draws a current flow towards it so that a voltage is applied across the impedance 10. That voltage can be tapped between the points 8 and 14, in particular between the measurement connection 14 and any connection with respect to the ground potential. It is a measure for the current flowing in the current-carrying conductor 2.

Figure 2:
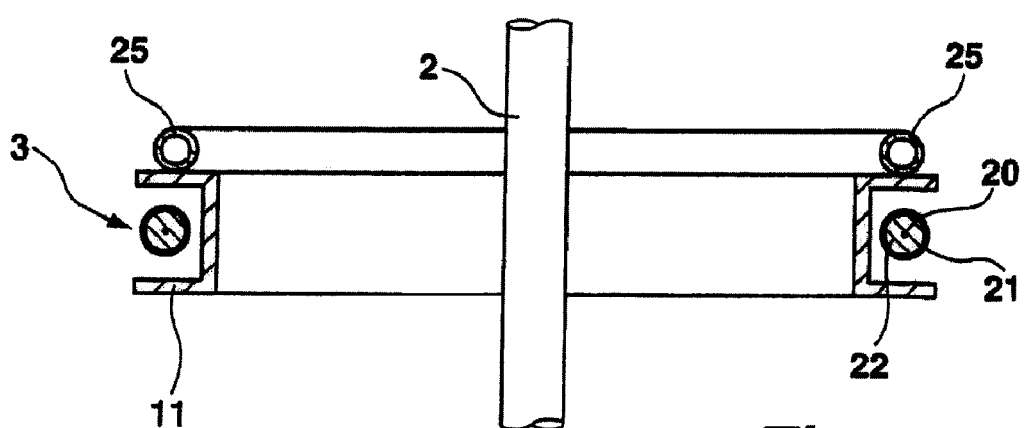
FIG. 2 is a cross-section along line II-II of FIG. 1.

FIG. 2 is a cross-section along line II-II of FIG. 1. Here, it can clearly be seen that the coil arrangement 3 is arranged inside an outwardly open coil shield 11 constructed in an annular manner, in particular as a hollow-body toroid. In the illustrated embodiment, the coil shield 11 is in the form of a closed ring shape and is U-shaped in cross-section, the U-shape preferably being formed by two limbs and a web that connects them so that substantially a rectangular shape is produced. Construction is thereby simplified. However, the coil shield 11 could also have a slotted ring shape. In particular, the shield 11 capacitively shields the coil arrangement 3 with respect to electrical fields produced by large voltages at the current-carrying conductor 2. It can clearly be seen that the return conductor 20 of the coil arrangement 3 is guided centrally in the windings 21, which are wound on a carrier 22.

A cooling body 25 in the form of a copper pipe is arranged on the coil shield 11 and guides coolant fluid for cooling the coil shield 11. The cooling body 25 has, at least in portions, a connection suitable for heat exchange with respect to the coil shield 11.

Figure 3A:
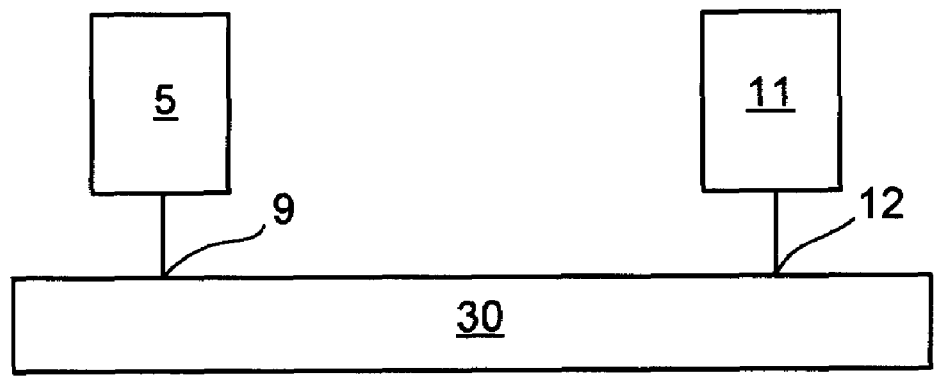
FIG. 3A shows the coil and circuit grounded to a common ground plate.
Figure 3B:
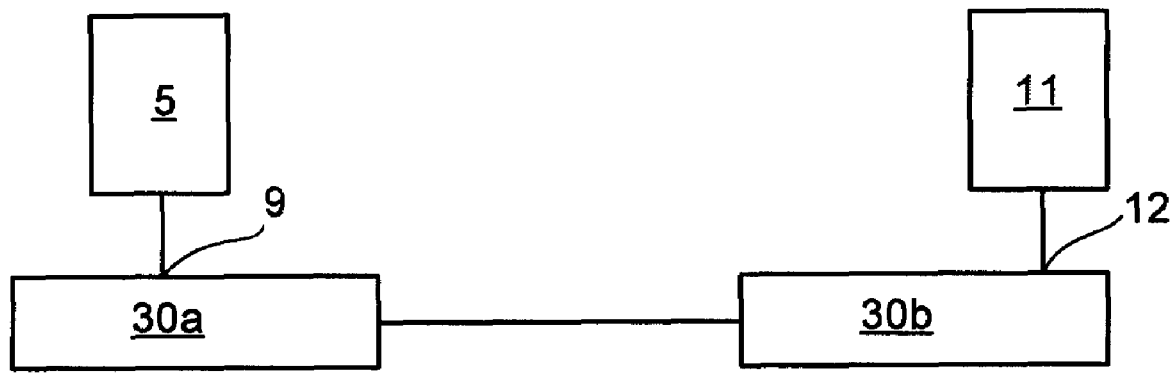
FIG. 3B shows the coil and circuit grounded to interconnected ground plates.

The ground connections 9, 12 of circuit 5 and coil assembly 11 can be connected directly to a single ground plate 30 at spaced-apart locations, as shown in FIG. 3A, or connected to respective ground plates 30a, 30b, that are themselves interconnected, as shown in FIG. 3B.

A number of embodiments of the invention have been described. Nevertheless, it will be understood that various modifications may be made without departing from the spirit and scope of the invention. Accordingly, other embodiments are within the scope of the following claims.

What is claimed is:

1. An electric current sensor comprising
a coil assembly with a coil conductor;
a circuit connected to the coil conductor;
a coil shield at least partially surrounding at least a portion of the coil assembly;
a conductive ground member; and
a cooling body arranged to cool the coil shield;
wherein the coil shield and the circuit are connected to the conductive ground member at respective, spaced apart ground connections.

2. The current sensor of claim 1, wherein the conductive ground member is a common ground plate to which the coil shield and circuit are independently connected.

3. The current sensor of claim 1, wherein the conductive ground member comprises two interconnected ground plates, the coil shield and circuit each connected to a respective one of the ground plates.

4. The current sensor of claim 1, wherein the circuit includes a circuit shield connected to the ground member, the circuit being arranged inside the circuit shield.

5. The current sensor of claim 1, wherein the coil assembly is substantially circular.

6. The current sensor of claim 1, wherein the coil shield is substantially circular.

7. The current sensor of claim 6, wherein the coil shield is formed as a hollow body toroid.

8. The current sensor of claim 7, wherein the toroid is substantially rectangular in cross-section.

9. The current sensor of claim 7, wherein the toroid is partially open.

10. The current sensor of claim 1, wherein the coil conductor is wrapped about a non-ferromagnetic carrier.

11. The current sensor of claim 10, wherein the coil assembly comprises a Rogowski coil.

12. The current sensor of claim 1, wherein the circuit comprises an impedance connected across the coil.

13. The current sensor of claim 12, wherein the impedance is a resistance.

14. The current sensor of claim 1, wherein the circuit has at least one measurement connection configured for connection to an evaluation device.

15. A method of measuring electrical current, the method comprising
placing a current sensor about an electrical conductor in a contact-free manner, the current sensor comprising
a coil assembly with a coil conductor;
a circuit connected to the coil conductor;
a conductive ground member;
a coil shield at least partially surrounding at least a portion of the coil assembly and
a cooling body arranged to cool the coil shield;
wherein the coil shield and the circuit are connected to the conductive ground member at respective, spaced apart ground connections;
flowing an electrical current along the conductor; and
measuring the flowing current with the sensor.

16. An electric current sensor comprising
a coil assembly with a coil conductor;
a circuit connected to the coil conductor;
a conductive circuit shield arranged to shield the circuit;
a conductive coil shield at least partially surrounding at least a portion of the coil assembly;
a conductive ground member; and
a cooling body arranged to cool the coil shield;
wherein the coil shield and the circuit shield are connected to the conductive ground member at respective, spaced apart ground connections.

17. The current sensor of claim 16, wherein the conductive ground member is a common ground plate to which the coil shield and the circuit are independently connected.

18. The current sensor of claim 16, wherein the conductive ground member comprises two interconnected ground plates, the coil shield and the circuit each connected to a respective one of the ground plates.

19. The current sensor of claim 16, wherein the circuit includes a circuit shield connected to the ground member, the circuit being arranged inside the circuit shield.

20. The current sensor of claim 16, wherein the coil assembly is substantially circular.

21. The current sensor of claim 16, wherein the coil shield is substantially circular.

22. The current sensor of claim 16, wherein the coil conductor is wrapped about a non-ferromagnetic carrier.

23. The current sensor of claim 16, wherein the circuit comprises an impedance connected across the coil.

24. The current sensor of claim 16, wherein the circuit has at least one measurement connection configured for connection to an evaluation device.

* * * * *